United States Patent Office 3,518,087

Patented June 30, 1970

3,518,087
GRAVURE ETCH RESIST FILM

Edward C. Yackel and Donald P. Foster, Rochester, N.Y., assignors to Eastman Kodak Company, Rochester, N.Y., a corporation of New Jersey No Drawing. Filed Apr. 26, 1967, Ser. No. 633,686
Int. Cl. G03c *1/90*
U.S. Cl. 96—83 12 Claims

ABSTRACT OF THE DISCLOSURE

Glue is added to the latex stripping layer of gravure etch resist film. The glue is extracted from the latex by means of an adjacent gelatin-containing layer and a porous latex stripping layer results, which layer permits easy stripping of the support and simple removal of latex and gelatin residues from the resist with water. In addition, an unextractable gelatin may be added to the stripping layer to modify the adhesion and stripping properties of the film.

This invention refers to gravure etch resist film. In one embodiment, glue is added to the latex stripping layer of gravure etch resist film.

Various light sensitive elements have been proposed for the preparation of etching resists for photogravure platemaking. These elements have included the use of a cellulose ester film base and a stripping layer adjacent to the layer containing the sensitized gelatin coating.

After exposure, the element, the emulsion of which has been exposed, is developed, fixed, washed and dried, which procedure differentially affects the gelatin of the emulsion layer imparting a hardening and insolubilizing effect to the gelatin around the silver grains of the image.

The processed gravure resist film is rolled, emulsion side down, onto the wetted surface of a copper gravure cylinder. Next, the film base support is gently peeled away leaving the emulsion adhering to the gravure cylinder or plate and the emulsion is washed with water for a short period of time. There remains a differentially hardened gelatin and silver image of varying degrees of thickness on the cylinder.

The stripping layer remains adherent to the upper surface of the gelatin relief that was formed by processing the sensitized gelatin coating. After the gelatin relief is applied to the copper surface to form a resist for subsequent etching, it has been necessary to employ an organic solvent to remove the residues of the stripping layer prior to the etching operation. In addition, the nature of the stripping layer has ordinarily required that special precautions be taken to prevent the formation of stripping blisters on the emulsion layer when the support is peeled therefrom.

In accordance with this invention, gravure etch resist film is provided which contains a srtipping layer that enables the support to be easily removed from the photosensitive emulsion layer after wet transfer and is itself simply removed from the resist with water and without the need for an organic solvent.

It has now been found that when a stripping layer comprising a mixture of latex of a water insoluble fusable polymeric compound dispersed in water and glue (low viscosity gelatin having less than about 5 cps. viscosity and less than 50 Shoom hardness) is employed in a gravure etch resist film in combination with an adjacent gelatin-containing layer, the glue is extracted from the glue-latex layer and leaves behind a porous latex stripping layer. The resulting porous latex layer is highly amenable to the stripping of the support layer from the photosensitivity emulsion layer and is itself easily removable from the emulsion layer with water since its porosity makes it water permeable. No organic solvent is necessary for this purpose. Moreover, the porosity of the latex layer permits water to contact the unhardened gelatin, which is between the resist and stripping layer, causing it to swell, dissolve and release the stripping layer to sluff away during the washout.

The extraction of the glue by the gelatin was wholly unexpected and does not occur when ordinary gelatins, e.g. bone gelatin, are substituted for the glue in the glue-latex mixture.

The stripping and adhesion properties of the etch resist film of this invention may be further enhanced by the inclusion of gelatin having a viscosity greater than 9 cps. and Shoom hardness greater than 150 in the stripping layer in addition to the glue (defined above). The presence of unextractable gelatin in the stripping layer imparts desirable processing properties to the stripping layer.

The etch resist film of this invention comprises the following layers in the order given:

(1) A dimensionally stable, temporary, film support, which may have a suitable subbing layer thereon;

(2) A stripping layer comprising a mixture of latex and glue [with the addition of unextractable gelatin being optional]; and (3) A hardener-free gelatin-containing photosensitive emulsion layer.

In addition, the etch resist film of this invention may include a thin layer of gelatin interposed between the glue modified stripping layer and the gelatin-containing photosensitive layer, which gelatin may serve to extract the glue from the latex layer. Alternatively, or in addition to the thin gelatin layer, an antihalation layer comprising gelatin and either an antihalation dye, a Carey Lea Silver layer or other light-absorbing materials, such as manganese dioxide, carbon, etc. may be employed adjacent to the photosensitive silver emulsion layer.

The temporary film support may comprise a conventional film base such as cellulose acetate, cellulose acetate butyrate, cellulose triacetate, cellulose butyrate, polyvinylchloride, polystyrene, polyesters such as poly(ethylene glycol terephthalate), polycarbonates and the like. Suitable, the temporary support may have a thickness on the order of 0.001 to 0.015 inch.

The film support may be provided with a subbing layer, such as a layer of cellulose nitrate, a terpolymer comprising vinylidene chloride, methyl methacrylate and itaconic acid, and the like.

The latex portion of the stripping layer of this invention is applied as an aqueous dispersion of a synthetic resin. Suitable resins for this purpose include copolymers of styrene and butadiene, vinylidene chloride and acrylonitrile, polyethylacrylate and acrylonitrile; homo and copolymers of polyvinyl chloride; terpolymers of methyl methacrylate, vinyl chloride and vinyl isobutyl ether; polyacrylonitrile, etc.

Suitable amounts of the glue in the latex layer include from about 10% to about 40% by weight, preferably from about 20% to about 35% based on the total solids.

As mentioned previously, the addition of non-extractable gelatin to the glue-latex layer will impart additional desirable properties to the layer. Accordingly, it is preferred that the stripping layer of this invention contain gelatin. Suitable amounts of the non-extractable gelatin include from about 25% to about 40%, preferably from about 30% to about 35%, based on the total solids content.

The dry coverage of the latex stripping layer may be from about 0.1 to about 0.5 of latex solids per square foot, preferably from about 0.3 to about 0.4 gram per square foot. The thickness of this layer may be from about .0001 inch to about .0005 inch.

As previously mentioned, a gelatin-containing antihalation layer may be interposed between the stripping layer and the photosensitive emulsion. The gelatin of this layer will extract the glue of the latex-glue layer and render the latex porous. The antihalation layer may contain Carey Lea silver, manganese dioxide or an antihalation dye such as one of the following:

(1) Congo red, (2) The product which results when 2-naphthylamine-6,8-disulfonic acid is diazotized and coupled with an equimolar amount of chromotopic acid, (3) The product (Schultz No. 208) which results when 1-naphthylamine-4-sulfonic acid is diazotized and coupled with an equimolar amount of 1-naphthol-4-sulfonic acid.

The antihalation layer may be suitably applied at a coverage of about 0.2 to about 0.4 gram per square foot, dry weight.

The photosensitive gelatin emulsion layer comprises silver halide and unhardened gelatin, without any hardeners therein. A silver bromoiodide emulsion has been found to be quite suitable for this purpose. However, various silver salts may be used as the sensitive salt such as silver bromide, silver iodide, silver chloride, or mixed silver halides such as silver chlorobromide. The reason for the emulsion layer being in unhardened condition is that in use of the element the gelatin of the silver-halide emulsion layer is differentially hardened in the processing bath so that a tanned image is formed in the exposed, developed areas of the emulsion layer.

An anti-curl layer may be utilized as a backing for the photosensitive element of this invention, and such layer may be of a composition similar to the antihalation layer described above. This layer prevents the curling of the support due to the photosensitive emulsion on the opposite side thereof. For example, the anti-curl layer may be a conventional gelatin pelloid containing either dyes or manganese dioxide. Other suitable anti-curl layers include a nitrocellulose lacquer, an alkyd resin coating or a lacquer including both nitrocellulose and alkyd resin. These coatings may be applied from a suitable solvent.

The various layers forming the photosensitive element of this invention including the glue-latex layer may be applied to the support, which may have a subbing layer, by one of the well-known techniques such as hopper, scraper, bead coating, transfer by immersed rollers or any of the other procedures well known in the art for the application of layers in preparing photographic products.

The glue modified latex layer is applied as an aqueous dispersion of a synthetic resin. The application of a stripping layer by means of an aqueous dispersion gives added safety to the film manufacturing operation, since it avoids the use of solvents that are volatile and inflammable.

Upon drying of the glue-latex layer, the gelatin or gelatin-containing layer is coated upon the glue-latex layer by one of the aforesaid methods. If a gelatin-containing layer other than a gelatin-silver halide emulsion layer, e.g. an antihalation layer, is applied adjacent the glue-latex layer, then the silver emulsion layer is applied in a separate run. The layers are applied in the order mentioned.

The film of this invention may be used in any of several gravure processes. For example, the element in accordance with this invention may be subjected to short exposure while in effective contact with an image or any other type of element, such as the image modulated light beam from a photo-electric scanning device, which will impart a latent image to the silver halide emulsion, as is well known in the photographic art.

After exposure, the element, the emulsion of which has been exposed, is developed, fixed, washed and dried, which procedure differentially affects the gelatin of the emulsion layer imparting a hardening and insolubilizing effect to the gelatin around the silver grains of the image.

A suitable method for processing the film is by a series of steps as follows:

(1) The element is bathed at 68° F. for 2 minutes in a developing solution consisting of:

| | Grams |
|---|---|
| Elon | 1.0 |
| Hydroquinone | 2.0 |
| Pyrogallic acid | 6.0 |
| Sodium sulfite | 9.0 |
| Potassium bromide | 1.5 |
| Sodium sulfate | 75.0 |
| Potassium metabisulfite | 5.0 |
| Water to make 1 liter. | |

(2) The liquid is drained off for 15 seconds.

(3) The element is developed at 68° F. for 2 minutes in an alkaline solution consisting of:

| | |
|---|---|
| Trisodium phosphate, grams | 100 |
| Sodium sulfate, grams | 75 |
| Phosphoric acid (85%), cc. | 5 |
| Water to make 1 liter. | |

(4) The liquid is drained off for 15 seconds and rinsed for 60 seconds at 68° F. in a bath consisting of sodium diacetate 100 grams, and water to make 1 liter.

(5) Fixing is carried out for 5 minutes at 68° F. in a bath of the following composition:

| | |
|---|---|
| Sodium thiosulfate, grams | 240 |
| Sodium sulfite (desiccated), grams | 10 |
| Sodium bisulfite, grams | 25 |
| Glacial acetic acid, cc. | 20 |
| Water to make 1 liter. | |

(6) Wash in running water for 5 to 10 minutes.

(7) Immerse in the following solution for 60 seconds at room temperature:

| | |
|---|---|
| Wetting agent, cc. | 10 |
| Semicarbazide hydrochloride, gram | 1 |
| Ammonium hydroxide (28%), cc. | 10 |
| Water to make 1 liter. | |

(8) Excess liquid is removed and the film is dried at either room temperature or elevated temperature.

After exposure and development, the film is applied to the moist surface of a gravure cylinder with the emulsion surface being in contact with the copper cylinder. Following the stripping of the support from the photosensitive layer, the non-tanned gelatin along with any latex material which is a residue of the latex stripping layer is easily removed by merely treating with water at 35° to 40° C.

The formation of the etched surface on the copper cylinder may be accomplished in any conventional manner. For example, the copper cylinder containing the relief image may be etched as follows: some sort of protection such as asphaltum may be applied to the area of the copper which are unprotected by the image and are not to be etched. The copper may be then subjected to an etching operation such, for example, as with ferric chloride. The copper surface is thereby differentially etched inversely to the thickness and hardness of the gelatin which resides on the surface of the copper. There results relief images adapted for use in photogravure printing operations.

The invention will be illustrated by the following examples, but it is to be understood that the invention is not restricted thereto. The percentages are by weight unless otherwise specified.

EXAMPLE 1

A substantially fully esterified, unsubbed, cellulose triacetate film serving as a temporary support is coated with an aqueous glue-latex dispersion. The dispersion comprises 2 parts by weight of a latex composed of a copolymer of ethylacrylate-acrylonitrile (75:25) containing 10 percent by weight dry material, and one part by weight glue containing 10 percent by weight solids in water in amounts sufficient to provide 0.3 gram of solids per square foot of film base. The coating of the latex layer is 5 microns in thickness.

After the latex layer is dry a gelatin-containing silver halide emulsion is applied over the latex stripping layer in an amount to provide 0.9 gram of dry gelatin per square foot of the latex layer.

The resulting photosensitive element is exposed and processed in a manner which is conventional for preparing a gravure etch resist. The processed element is then applied to a copper plate by means of wet transfer and the cellulose triacetate support is easily stripped away. The latex residue is completely removed by washing with water, which is at a temperature of 40° C. No formation of stripping blisters is observed on the photosensitive emulsion layer after the temporary support has been stripped away.

The following example illustrates the addition of unextractable gelatin to the glue-latex stripping layer.

EXAMPLE 2

The procedure of Example 1 is repeated except that the stripping layer comprises 2 parts by weight of the latex, and 1 part by weight glue to which is added 1 part by weight of an unextractable gelatin containing 10 percent by weight solids.

The temporary support strips away easily without the formation of stripping blisters in the silver-gelatin emulsion layer. The residue of the glue-latex stripping layer is easily removed from the emulsion layer by washing with 40° C. water.

The following example is for comparative purposes and illustrates the problems encountered when the glue-latex stripping layer of this invention is not employed.

EXAMPLE 3

The procedure of the previous example is repeated except that bone gelatin is substituted for glue in the stripping layer.

After the temporary support is stripped away, the latex layer adhering to the silver-gelatin emulsion layer is washed with water at a temperature of 40° C. It is observed that latex residues still adhere to the emulsion layer after the water wash. An organic solvent, such as denatured alcohol, is required to completely remove the latex residues from the gelatin resist.

"Photographic Gelatin" by R. J. Croome and F. G. Clegg, 1965, Focal Press, London, at p. 72 discusses gel strength as follows:

"The firmness, or resistance to deformation, of a gel prepared from gelatin under standard conditions is normally determined by using a Bloom Gelometer and is referred to as Bloom Jelly Strength. By definition, this is the weight in grams required to produce by means of a plunger 12.7 mm. in diameter a depression of 4 mm. in the surface of a gel of concentration 6⅔% by weight which has been measured at 10° C. plus or minus 0.1° for a period of 16–18 hours. The conditions of test as laid down in the British Standards Specification 757:1959, must be rigidly adhered to to ensure uniform results."

The Bloom jelly strength is an arbitrary, empirical practical measurement of firmness or resistance to deformation of a gel. A more exact dimensionally accurate measurement of this property would be a measurement of modulus of rigidity (Starrheitsmodul) but the Bloom jelly strength has proved to be a useful, practical measurement.

At the Eastman Kodak Research Laboratories, Dr. Shepard did extensive work with gelatin and for his own purposes found it was useful to modify the prescribed Bloom method by changing concentration of the gelatin from 6⅔% by weight to 6.1% by weight. Dr. Shepard's modified procedure has been followed here and has come to be called Shoom jelly strength. In all other respects the Shoom method is exactly the same as the Bloom method. Both Bloom and Shoom jelly strengths are expressed in grams, which states the weight in grams required to produce a specified depression in the gel according to prescribed test procedures.

The invention has been described in considerable detail with particular reference to certain embodiments thereof, but it is understood that modifications and variations can be effected within the spirit and scope of the invention as described hereinabove and as defined in the appended claims.

We claim:

1. A gravure resist film comprising a temporary film support containing thereon:

(1) a stripping layer comprising a mixture of latex of a synthetic resin and glue having less than about 5 cps. viscosity and less than 50 Shoom hardness;

(2) a hardener-free light sensitive gelatin-silver halide photographic emulsion layer, in that order.

2. The element of claim 1 wherein the stripping layer additionally contains gelatin.

3. The element of claim 1 wherein a layer of gelatin is interposed between the stripping layer (1) and the photographic emulsion layer (2).

4. The element of claim 1 wherein a gelatin-containing antihalation layer is interposed between the stripping layer (1) and the photographic emulsion layer (2).

5. The element of claim 1 wherein the latex comprises a copolymer of alkylacrylate and acrylonitrile.

6. The element of claim 5 wherein the alkyl group is ethyl.

7. The element of claim 1 wherein the temporary film support comprises cellulose triacetate.

8. The element of claim 2 wherein the stripping layer comprises about 2 parts by weight of a latex, about 1 part by weight glue, and about 1 part by weight gelatin.

9. A method for the production of a gravure resist film, the steps which comprise:

(1) coating the surface of a sheet of a temporary film support with a coating composition comprising an aqueous dispersion of latex of a synthetic resin and glue having less than about 5 cps. viscosity and less than 50 Shoom hardness, (2) drying the applied coating to provide a layer comprised of latex and glue, (3) applying a gelatin-silver halide photographic emulsion layer on the glue-latex layer.

10. The method of claim 9 wherein the aqueous dispersion of latex and glue additionally contains gelatin.

11. The method of claim 9 wherein the latex is a copolymer of alkylacrylate and acrylonitrile.

12. The method of claim 11 wherein the alkyl group is ethyl.

References Cited

UNITED STATES PATENTS

| | | | |
|---|---|---|---|
| 2,140,648 | 12/1938 | Nadeau | 96—83 |
| 2,083,640 | 6/1937 | Couch et al. | 96—83 |
| 2,143,791 | 1/1939 | Nadeau | 96—83 |
| 2,182,814 | 12/1939 | Marasco | 96—83 |
| 3,091,534 | 5/1963 | Nadeau et al. | 96—83 |
| 3,148,063 | 9/1964 | Yackel et al. | 96—83 |
| 3,396,025 | 8/1968 | Guestaux et al. | 96—83 |

RONALD H. SMITH, Primary Examiner

U.S. Cl. X.R.

96—84